(12) United States Patent
Beckhart et al.

(10) Patent No.: US 6,568,098 B1
(45) Date of Patent: May 27, 2003

(54) ALIGNMENT WAFER

(75) Inventors: Gordon Haggott Beckhart, Colorado Springs, CO (US); Patrick Rooney Conarro, Green Mountain Falls, CO (US); Kamran Michael Farivar-Sadri, Colorado Springs, CO (US)

(73) Assignee: Microtool, Inc., Colorado Springs, CO (US)

( * ) Notice: Subject to any disclaimer, the term of this patent is extended or adjusted under 35 U.S.C. 154(b) by 0 days.

(21) Appl. No.: 10/035,495

(22) Filed: Dec. 28, 2001

(51) Int. Cl.[7] ............................................. G01B 11/26
(52) U.S. Cl. ....................................................... 33/645
(58) Field of Search .......................... 33/533, 562, 563, 33/565, 613, 645; 414/936; 438/14; 356/401

(56) References Cited

U.S. PATENT DOCUMENTS

| | | | | |
|---|---|---|---|---|
| 4,295,276 A | * | 10/1981 | Ellington, III | ............... 33/644 |
| 4,718,767 A | * | 1/1988 | Hazama | ....................... 356/389 |
| 5,408,753 A | * | 4/1995 | Hong | ........................... 33/562 |
| 5,456,018 A | * | 10/1995 | Irlbeck et al. | ................ 33/645 |
| 5,545,593 A | * | 8/1996 | Watkins et al. | ............... 438/16 |
| 5,923,996 A | * | 7/1999 | Shih et al. | .................... 438/462 |
| 6,082,009 A | * | 7/2000 | Tillis et al. | .................... 33/613 |
| 6,274,395 B1 | * | 8/2001 | Weber | .......................... 438/14 |
| 6,281,032 B1 | * | 8/2001 | Matsuda et al. | .............. 438/42 |
| 6,301,798 B1 | * | 10/2001 | Liu et al. | ....................... 33/645 |
| 6,406,583 B1 | * | 6/2002 | Harden et al. | .............. 156/250 |
| 6,433,352 B1 | * | 8/2002 | Oka | ........................... 356/401 |

* cited by examiner

Primary Examiner—G. Bradley Bennett
(74) Attorney, Agent, or Firm—Law Office of Dale B. Halling, LLC

(57) ABSTRACT

An alignment wafer for a semiconductor processing tool has a disk having a radius of a standard semiconductor wafer. The disk is formed of a flexible, substantially non-deformable material. A concentric transparent disk is inside of the disk.

12 Claims, 1 Drawing Sheet

ALIGNMENT WAFER

FIELD OF THE INVENTION

The present invention relates generally to the field of semiconductors and more particularly to an alignment wafer for a semiconductor processing tool.

BACKGROUND OF THE INVENTION

Integrated circuits are formed on semiconductor wafers. These wafers are processed by a number of different stations. For instance, one station may be a photographic station where the photoresist is exposed. A second station may be developer station that washes away the photoresist that is unexposed (exposed in another variation). When a semiconductor wafer is not correctly aligned on a chuck (commonly vacuum) of one of the processing stations, the pattern may be incorrect and the underlying circuit will not work. This results is substantially economic loss to the manufacturer. One solution has been to create alignment wafers made of aluminum. This allows the operator to check that the wafer is correctly aligned. Unfortunately aluminum alignment wafers bend easily and then they do not sit in the processing station correctly. Another solution has been to use glass alignment wafers. Glass wafers have a tendency to break and are heavier than semiconductor wafers. Because they are heavier they cannot be held in place by the vacuum chucks as well. One other solution has been to use carbon fiber wafers. These are not transparent and as a result are difficult to align to the chucks.

Thus there exists a need for alignment wafer that can overcome these problems.

DETAILED DESCRIPTION OF THE DRAWINGS

An alignment wafer for a semiconductor processing tool has a first substantially planar surface having a circular edge. A second substantially planar surface is parallel to the first substantially planar surface and offset from the first substantially planar surface. The second substantially planar surface having a circular edge. A fiber carbon composite material fills a space between the first substantially planar surface and the second substantially planar surface. A concentric disk fits within the fiber carbon composite material and is transparent. The invention provides a highly flexible alignment wafer that when bent rebounds (non-deformable) to its original shape. This durability makes the alignment wafer less expensive to use. The transparent concentric disk allows the operator to see the chuck through the alignment wafer. This enables the operator to check the alignment easily. In addition, the invention is light enough for the chucks and other wafer handling equipment to handle the alignment wafer.

Figure 1:
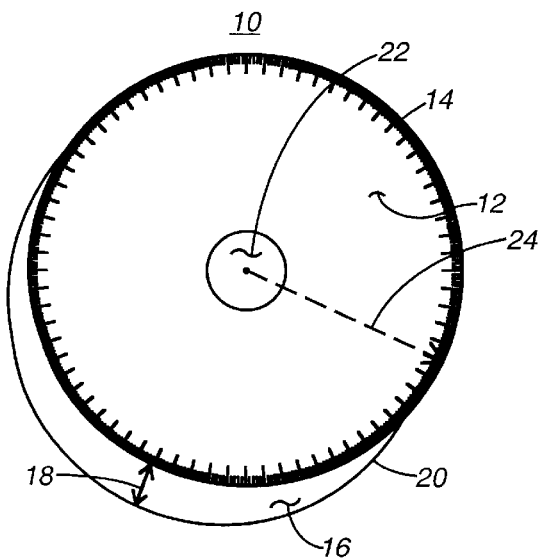
FIG. 1 is a perspective view of an alignment wafer in accordance with one embodiment of the invention.

FIG. 1 is a perspective view of an alignment wafer 10 in accordance with one embodiment of the invention. The alignment wafer 10 has a first substantially planar surface 12 that has a circular edge 14. A second substantially planar surface 16 is parallel and offset 18 to the first substantially planar surface 12. The second substantially planar surface 16 has a circular edge 20. A fiber carbon composite material fills the space 18 between the first substantially planar surface 12 and the second substantially planar surface 16. A concentric disk 22 is within the fiber carbon composite material and is transparent. The first substantially planar surface has a radius 24 of a standard semiconductor wafer (e.g., 100 mm, 120 mm, 150 mm, 200 mm, 300 mm). In one embodiment the concentric disk 22 is formed of polycarbonate. In another embodiment the first substantially planar surface has a flatness of plus or minus 0.002 inches (0.051 mm). The flatness is important to the alignment wafer so that the wafer has the same essential physical dimensions as a real semiconductor wafer. The thickness 18 of the alignment wafer is approximately the same as a standard semiconductor wafer in one embodiment.

Figure 2:
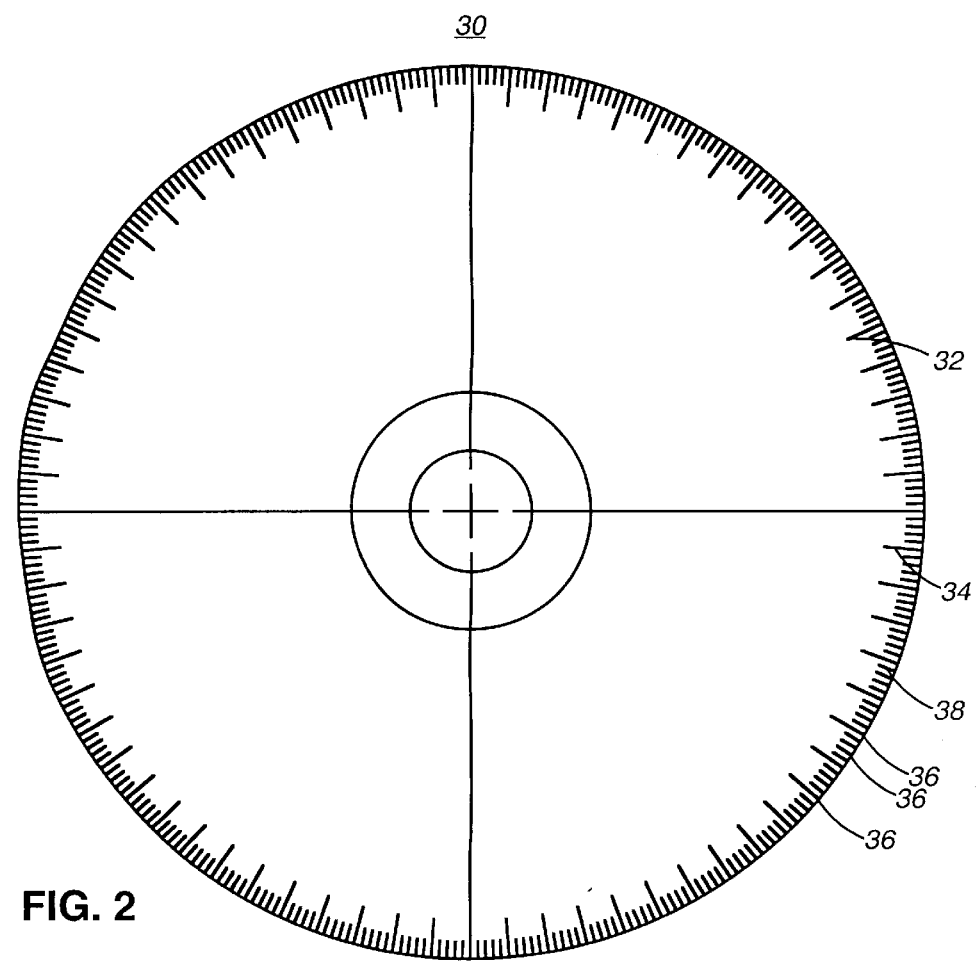
FIG. 2 is a top view of a photograph of an alignment wafer in accordance with one embodiment of the invention.

FIG. 2 is a top view of a photograph of an alignment wafer 30 in accordance with one embodiment of the invention. The wafer 30 has a transparent disk 32. An annular ring (disk) 34 is concentric with the transparent disk 32. The annual ring 34 is formed of a flexible material such as a fiber carbon composite in one embodiment. In another embodiment, the annual ring 34 is also made of a transparent material. The transparent material may be the same material as the transparent disk or may be a different material. The wafer has a plurality of gradient markings 36 formed on a circumference 38 of the alignment wafer.

Thus there has been described an alignment wafer that is highly flexible and non-deformable, has a transparent center for viewing a chuck and has approximately the same weight and physical dimensions as a semiconductor wafer.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

What is claimed is:

1. An alignment wafer for a semiconductor processing tool, comprising:
    a first substantially planar surface having a circular edge;
    a second substantially planar surface parallel to the first substantially planar surface and offset from the first substantially planar surface, the second substantially planar surface having a circular edge;
    a fiber carbon composite material filling a space between the first substantially planar surface and the second substantially planar surface; and
    a concentric disk within the fiber carbon composite material, wherein the concentric disk is transparent.

2. The alignment wafer of claim 1, wherein the concentric disk is formed using a polycarbonate.

3. The alignment wafer of claim 1, wherein the first substantially planar surface has a flatness of plus of minus 0.002 inches (0.051 mm).

4. The alignment wafer of claim 1, wherein the first substantially planar surface has a radius of a standard semiconductor wafer.

5. The alignment wafer of claim 1, wherein the offset is a standard thickness for a semiconductor wafer.

6. The alignment wafer of claim 1, further including a plurality of gradient markings formed on a circumference of the first substantially planar surface.

7. An alignment wafer for a semiconductor processing tool, comprising:
    a transparent disk;
    an annular ring concentric with the transparent disk, the annular ring formed of a flexible material; and
    the annular ring having a first substantially planar surface with a flatness of plus or minus 0.002 inches (0.051 mm).

8. The alignment wafer of claim 7, wherein the transparent disk is formed of polycarbonate.

9. The alignment wafer of claim 7, wherein the annular ring is formed of a fiber carbon composite.

10. An alignment wafer for a semiconductor processing tool, comprising:
   a disk having a radius of a standard semiconductor wafer;
   the disk being formed of a substantially flexible, non-deformable material; and
   a concentric transparent disk inside of the disk.

11. The alignment wafer of claim 10, wherein the substantially flexible, non-deformable material is a carbon fiber composite material.

12. The alignment wafer of claim 10, wherein the concentric disk is formed of a polycarbonate material.

* * * * *